(12) United States Patent
Kris et al.

(10) Patent No.: US 9,048,863 B2
(45) Date of Patent: Jun. 2, 2015

(54) PULSE DENSITY DIGITAL-TO-ANALOG CONVERTER WITH SLOPE COMPENSATION FUNCTION

(71) Applicant: Microchip Technology Incorporated, Chandler, AZ (US)

(72) Inventors: Bryan Kris, Gilbert, AZ (US); Andreas Reiter, Feldkirchen (DE); Tibor Futo, Budapest (HU); Alex Dumais, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/202,420

(22) Filed: Mar. 10, 2014

(65) Prior Publication Data
US 2014/0266833 A1    Sep. 18, 2014

Related U.S. Application Data

(60) Provisional application No. 61/777,808, filed on Mar. 12, 2013.

(51) Int. Cl.
*H03M 1/66* (2006.01)
*H02M 3/157* (2006.01)
*H02M 3/335* (2006.01)

(52) U.S. Cl.
CPC ............... *H03M 1/66* (2013.01); *H02M 3/157* (2013.01); *H02M 3/33515* (2013.01)

(58) Field of Classification Search
USPC .......... 341/144, 141, 152, 143; 375/238, 242, 375/243
See application file for complete search history.

(56) References Cited

U.S. PATENT DOCUMENTS

| 3,689,914 | A | 9/1972 | Butler ........................... 341/147 |
| 5,525,874 | A | 6/1996 | Mallarapu et al. ........ 318/400.13 |
| 6,281,822 | B1 | 8/2001 | Park ............................. 341/144 |
| 6,317,067 | B1 * | 11/2001 | Mohindra ..................... 341/145 |
| 6,459,398 | B1 | 10/2002 | Gureshnik et al. ............ 341/144 |
| 6,489,909 | B2 * | 12/2002 | Nakao et al. ................... 341/144 |
| 6,606,044 | B2 * | 8/2003 | Roeckner et al. ............. 341/143 |
| 2006/0233234 | A1 | 10/2006 | Lim ............................... 375/239 |
| 2012/0176824 | A1 | 7/2012 | Franklin et al. ................. 363/79 |

FOREIGN PATENT DOCUMENTS

| EP | 2299577 A1 | 3/2011 | ............. H02M 3/156 |
| WO | 00/01075 A1 | 1/2000 | ............. H03M 7/32 |

OTHER PUBLICATIONS

International Search Report and Written Opinion, Application No. PCT/US2014/023049, 10 pages, Oct. 6, 2014.

* cited by examiner

*Primary Examiner* — Peguy Jean Pierre
(74) *Attorney, Agent, or Firm* — King & Spalding L.L.P.

(57) ABSTRACT

A slope compensation module provides slope compensation of a switched-mode power supply using current mode control. This slope compensation function may be provided by a digital slope compensation generator and a pulse density modulated digital-to-analog converter (PDM DAC) having a selectable response mode low pass filter.

20 Claims, 15 Drawing Sheets

Figure 2 (Prior Technology)

Figure 3 (Prior Technology)

PULSE DENSITY DIGITAL-TO-ANALOG CONVERTER WITH SLOPE COMPENSATION FUNCTION

RELATED PATENT APPLICATION

This application claims priority to commonly owned U.S. Provisional Patent Application Ser. No. 61/777,808; filed Mar. 12, 2013; which is hereby incorporated by reference herein for all purposes.

TECHNICAL FIELD

The present disclosure relates to switch mode power supplies (SMPS), and, more particularly, to providing slope compensation in the SMPS with a digital-to-analog converter (DAC) using pulse density modulation (PDM).

BACKGROUND

Normally in a switch mode power supply (SMPS) the peak current value is related to the average current in the inductor. But with some SMPS circuit topologies, when the pulse width modulation (PWM) duty cycle is greater than 50 percent there is a changing relationship between the peak and the average current through the inductor, where the peak current is no longer proportional to the average current. This may cause instability, e.g., sub-harmonic oscillation. The basic cause of this instability (sub-harmonic oscillation) is that the inductor current does not return to zero by the start of the next PWM cycle. To prevent this instability many SMPS applications use a control methodology called "Peak Current Mode Control" (PCMC). PCMC sets a maximum or peak level for the inductor current. The SMPS power inductor current may be monitored with an analog comparator. The threshold of this comparator sets the peak current limit of the SMPS inductor. Referring to FIG. 1, the peak current is related to the average current (with some assumptions). For digital implementations of PCMC applications, a digital-to-analog converter (DAC) is used to provide the threshold voltage to the comparator.

PCMC modulates a downward slope onto the current reference value to stabilize the power circuit. This scales the peak inductor current with a decreasing reference slope as the PWM cycle progresses. The basic idea to limit the circuit to a peak current level that can be properly discharged before the next PWM cycle begins.

Referring to FIG. 2, depicted is a schematic block diagram of a prior technology analog slope compensation circuit used in a SMPS. The reference voltage used for peak current detection is reduced as the user's PWM duty cycle duration increases. Referring to FIG. 3, depicted is a schematic block diagram of a portion of the prior technology analog slope compensation circuit shown in FIG. 2. There are a number of issues when using analog slope compensation. For example, analog circuits are expensive. Analog circuit implementations require external components for configuration, or need highly adaptable internal function modules in the PWM controller integrated circuit. The analog slope generator has a limited voltage range. In addition, in small process geometry integrated circuits the necessary analog circuits required for slope compensation functionality are too large and expensive to build and are therefore not cost effective for use in price sensitive products.

SUMMARY

Therefore, a need exists to provide slope compensation functionality for SMPS systems with a low cost, mixed signal (analog and digital) integrated circuit solution.

According to an embodiment, a pulse density modulated digital-to-analog converter (PDM DAC) with slope compensation function may comprise: the PDM DAC may comprise a PDM DAC accumulator, PDM DAC adder having an output coupled to an input of the PDM DAC accumulator and a second input coupled to an output of the PDM DAC accumulator, a PDM DAC multiplexer having an output coupled to a first input of the PDM DAC adder, and a PDM DAC increment value register having an output coupled to a first input of the PDM DAC multiplexer; a slope generator may comprise a slope generator accumulator having an output coupled to a second input of the PDM DAC multiplexer, a slope generator multiplexer having an output coupled to an input of the slope generator accumulator and a first input coupled to the output of the PDM DAC increment value register, a slope value register, a slope generator adder having an output coupled to a second input of the slope generator multiplexer, a first input coupled to an output of the slope value register and a second input coupled to the output of the slope generator accumulator, a non-positive detect circuit having an input coupled to the output of the slope generator accumulator, and control logic having an input coupled to an output of the non-positive detect circuit, a first control output coupled to an enable input of the slope generator accumulator and a second control output coupled to a control input of the slope generator multiplexer; and a D-latch having a D-input coupled to a carry-out output of the PDM DAC adder and a clock input coupled to a clock signal; wherein when a zero or negative output from the slope generator accumulator may be detected by the non-positive detect circuit the control logic forces a zero output from the slope generator accumulator, and when a slope mode control signal may be applied to the PDM DAC multiplexer the first input of the PDM DAC adder may be coupled to the output of the slope generator accumulator, otherwise to the output of the PDM DAC increment value register.

According to a further embodiment, a low pass filter may be provided having an input coupled to an output of the D-latch. According to a further embodiment, the low pass filter response characteristics may be selectable. According to a further embodiment, the low pass filter comprises a plurality of poles. According to a further embodiment, a slope value may be positive in the slope value register. According to a further embodiment, a two's complement circuit may be provided for two's complementing the positive slope value in the slope value register before coupling the two's complemented slope value to the slope generator adder. According to a further embodiment, a slope value may be negative in the slope value register. According to a further embodiment, an under flow detection circuit may be provided having an input coupled to the output of the slope generator adder and an output coupled to an input of the control logic. According to a further embodiment, a switched-mode power supply (SMPS) controller may comprise the PDM DAC with slope compensation.

According to another embodiment, a pulse density modulated (PDM) digital-to-analog converter (DAC) with slope compensation function may comprise: a PDM accumulator circuit for generating a PDM pulse stream with a pulse density proportional to an input data value, wherein the PDM accumulator operates at very high speeds to minimize output low pass filter requirements when converting the PDM pulse stream into an analog voltage; and a slope accumulator circuit that modifies the input data value to the PDM DAC so as to create a controlled change in a PDM pulse density, wherein the slope accumulator circuit provides a slope compensation function. According to a further embodiment, a selectable response low pass analog filter may be provided for converting the PDM pulse stream into the analog voltage.

According to yet another embodiment, a switch mode power supply (SMPS) having a PDM DAC with slope compensation function may comprise: power converter may comprise a power inductor, power switching transistor, rectifiers and filter capacitor; and a mixed signal integrated circuit may comprise pulse width modulation (PWM) generator, a digital processor coupled to and issuing PWM commands to the PWM generator, an analog-to-digital converter (ADC) having an analog input coupled to a voltage output of the filter capacitor of the power converter, a PDM generator, a voltage comparator having a first input coupled to a current measurement circuit in the power converter, a pulse density modulated digital-to-analog converter (PDM DAC) with slope compensation function, and having an analog output coupled to a second input of the voltage comparator and a control input coupled to an output of the voltage comparator. According to a further embodiment, the mixed signal integrated circuit may be a microcontroller.

According to yet another embodiment, a method of providing slope compensation voltages in a current mode controlled switch mode power supply (SMPS) may comprise the steps of: generating pulse division modulated (PDM) signals with a PDM digital-to-analog converter (DAC); modifying the PDM DAC signals with a digital slope generator; and coupling the modified PDM DAC signals to an analog low pass filter for providing slope compensation voltages in a current mode controlled SMPS.

According to a further embodiment of the method, the analog low pass filter has a plurality of poles. According to a further embodiment of the method, the analog low pass filter has selectable filter characteristics. According to a further embodiment of the method, may comprise the step of selecting characteristics of the low pass filter. According to a further embodiment of the method, the step of selecting the characteristics of the low pass filter provides for reduced voltage ripple. According to a further embodiment of the method, may comprise the steps of: detecting a zero value in a slope accumulator; and forcing the zero value to remain in the slope accumulator when the zero value may be detected. According to a further embodiment of the method, may comprise the step of disabling the digital slope generator to reduce power consumption.

BRIEF DESCRIPTION OF THE DRAWINGS

A more complete understanding of the present disclosure may be acquired by referring to the following description taken in conjunction with the accompanying drawings wherein.

Figure 1:
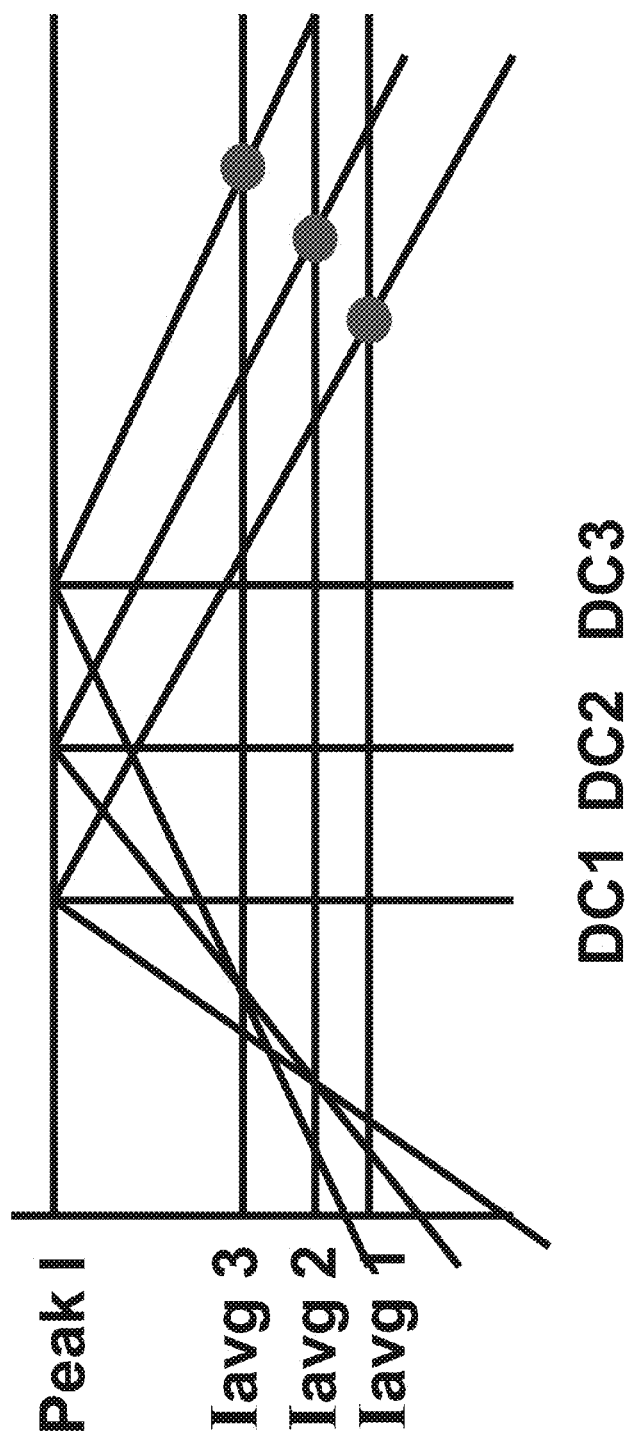
FIG. 1 illustrates a schematic graph of peak-to-average current relationships in a switched-mode power supply (SMPS) using "Peak Current Mode Control," according to the teachings of this disclosure.
Figure 2:
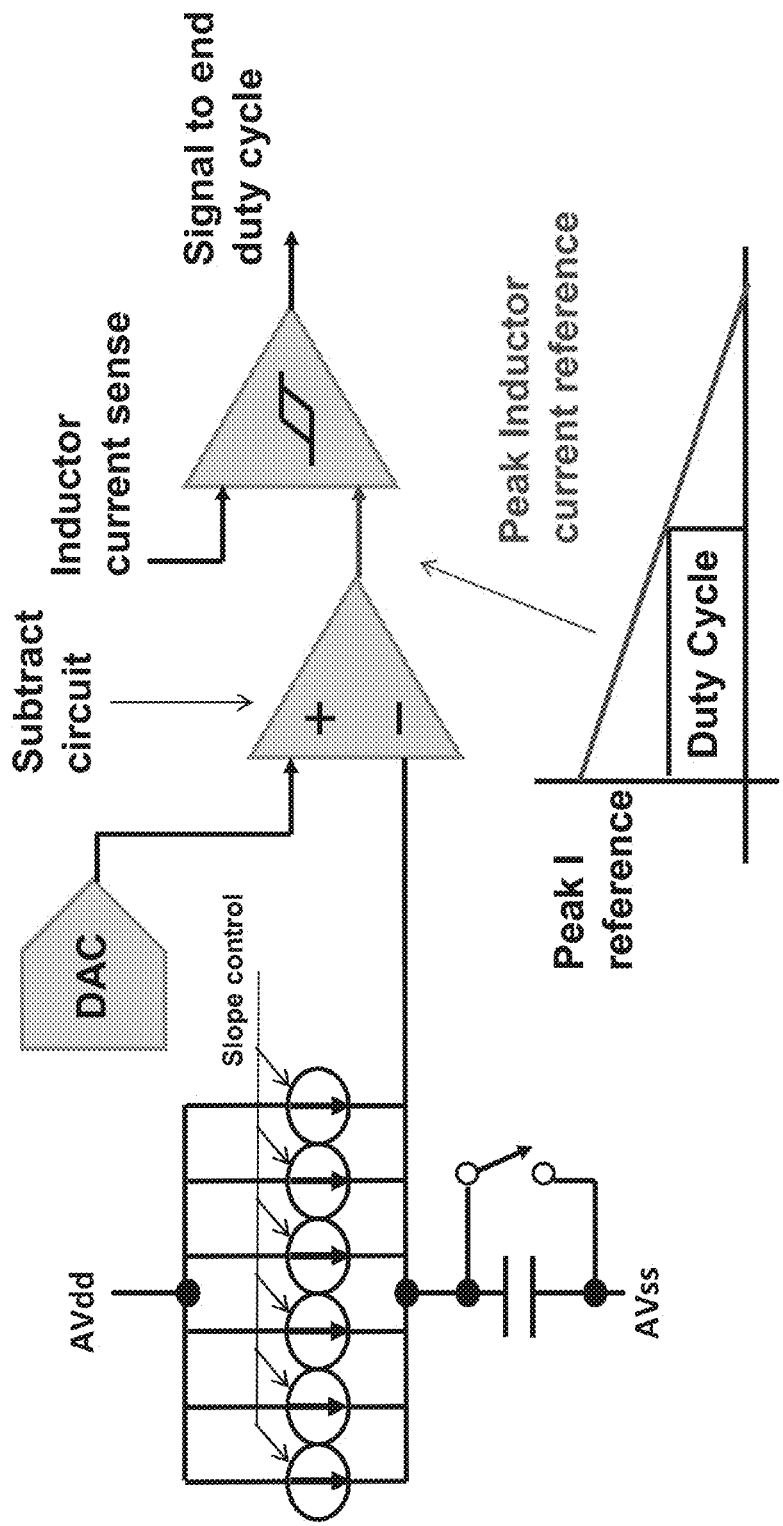
FIG. 2 illustrates a schematic block diagram of a prior technology analog slope compensation circuit used in a SMPS.
Figure 3:
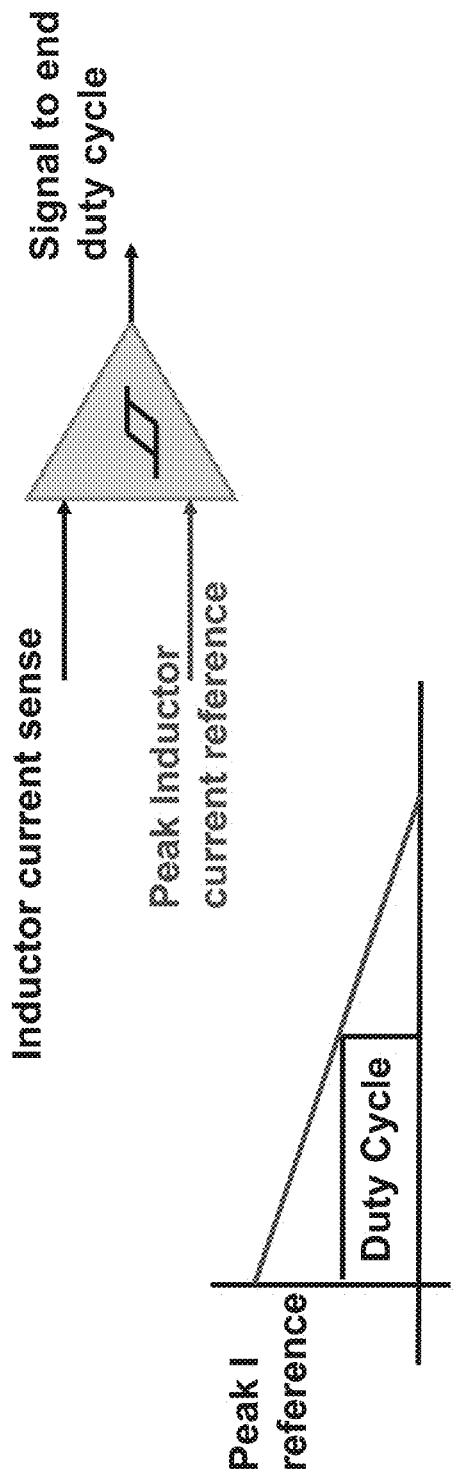
FIG. 3 illustrates a schematic block diagram of a portion of the prior technology analog slope compensation circuit shown in FIG. 2.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

The PDM DAC (Pulse Density Modulated Digital-To-Analog Converter) provides a low cost way to generate reference voltages to analog comparators for motor control and SMPS applications. The PDM DAC module is largely a digital design, so porting is not an issue when moving to new process technologies. The large digital content scales well with process scaling.

According to various embodiments of this disclosure, slope compensation functionality for SMPS systems may be provided with a digital-to-analog converter (DAC) using pulse density modulation (PDM), a digital slope generator, and a selectable response mode low pass filter, e.g., resistor-capacitor (RC), having at least one pole.

Referring now to the drawings, the details of specific example embodiments are schematically illustrated. Like elements in the drawings will be represented by like numbers, and similar elements will be represented by like numbers with a different lower case letter suffix.

Figure 4:
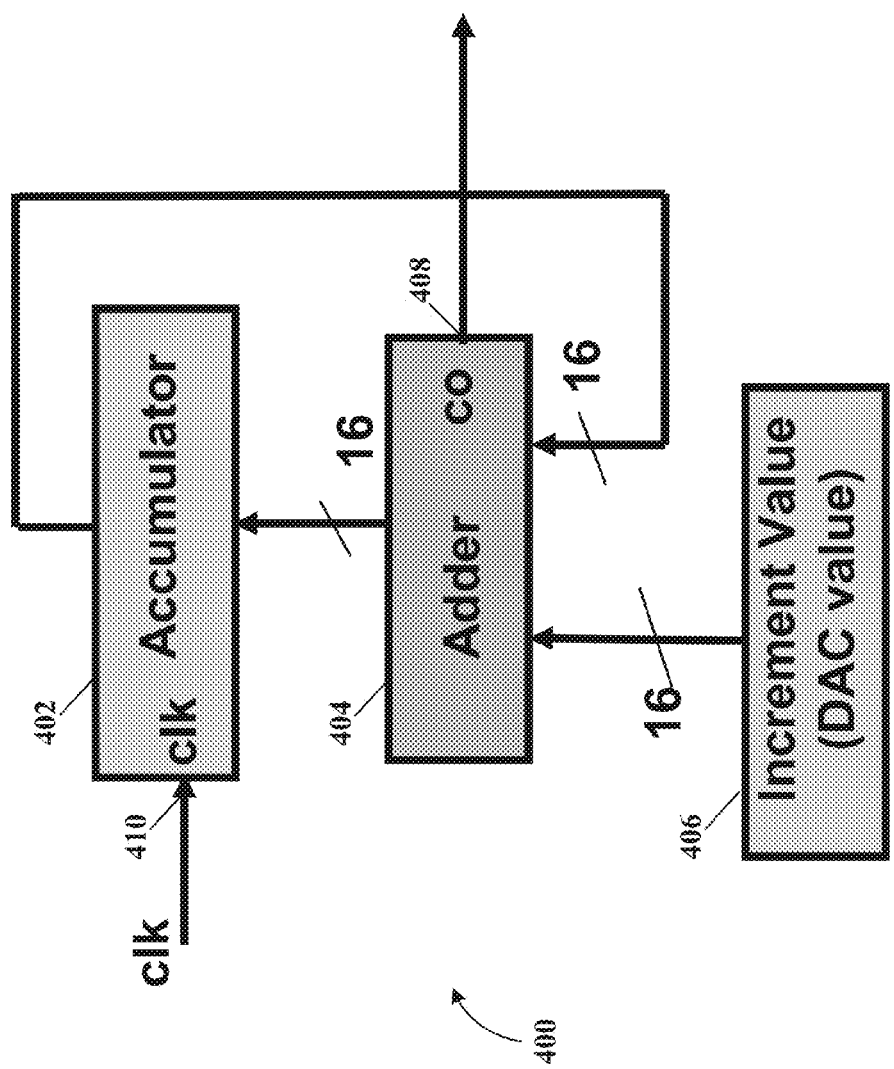
FIG. 4 illustrates a schematic block diagram of a phase accumulator functioning as a pulse density modulation (PDM) generator, according to the teachings of this disclosure.

Referring to FIG. 4, depicted is a schematic block diagram of a phase accumulator functioning as a PDM generator. A phase accumulator/PDM generator, generally represented by the numeral 400, may comprise an accumulator 402, an adder 404 and an increment value register 406. A carry out signal 408 is generated each time the sum of an increment value in the increment value register 406 and a value in the accumulator 402 cause a "roll over" with a carry output (CO) 408. For example with a 16-bit accumulator 402, if the increment value=0x8000, then the carry out signal 408 is asserted every other clock cycle yielding a 50 percent on versus off time. The ratio of carry outs 408 versus clock cycles 410 equals the ratio of the increment value in the increment register 406 versus the maximal value of adder 404. This digital "carry output" 408 is distributed through time, comprising a "Pulse Density Modulation" (PDM) format. The phase accumulator/PDM generator 400 maintains the high frequency content of the clock source signal 410, easing low pass filter requirements.

Figure 5:
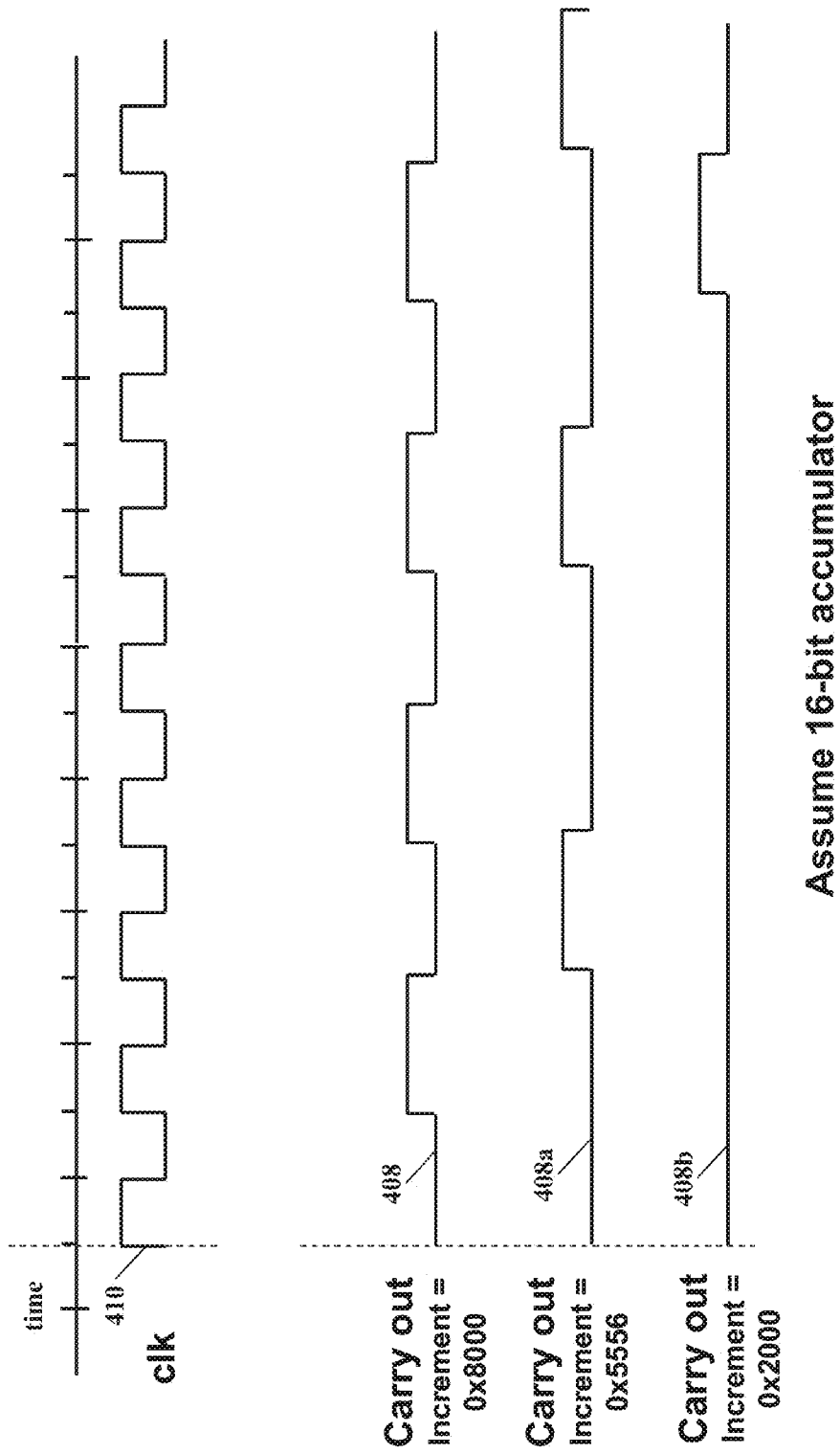
FIG. 5 illustrates schematic waveform timing diagrams of a phase accumulator carry output of a PDM generator for various increment values, according to the teachings of this disclosure.

Referring to FIG. 5, depicted are schematic waveform timing diagrams of a phase accumulator carry output of a PDM generator for various increment values, according to the teachings of this disclosure. For an increment value of 8000 (octal) the carry out 408 has a duty cycle of about 50 percent. For an increment value of 5556 (octal) the carry out 408a has a duty cycle of about 25 percent. For an increment value of 2000 (octal) the carry out 408b has a duty cycle of about 12.5 percent.

Figure 6:
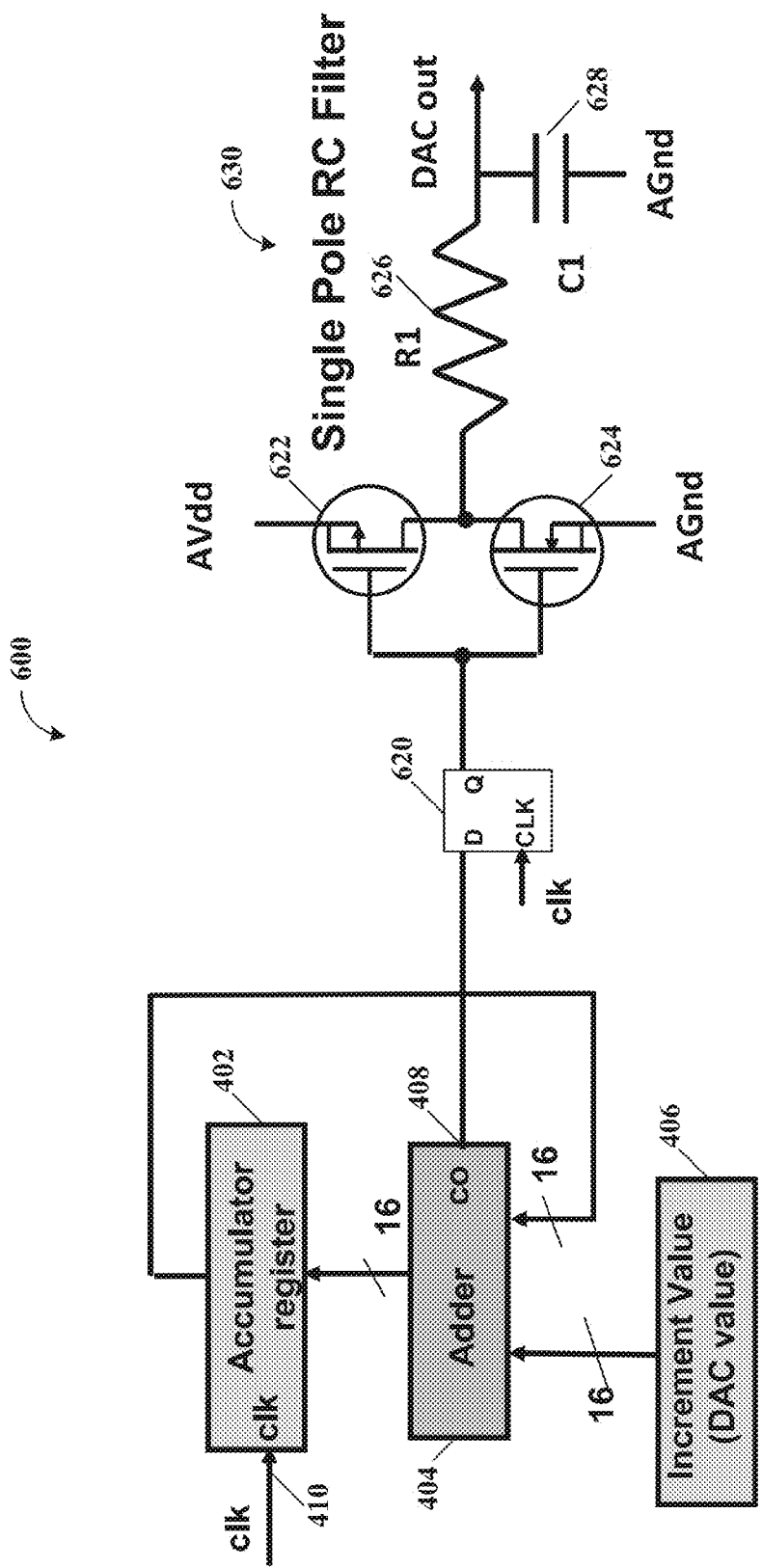
FIGS. 6, 6A and 6B illustrate schematic block diagrams of simplified PDM DACs, according to specific example embodiments of this disclosure.
Figure 6A:
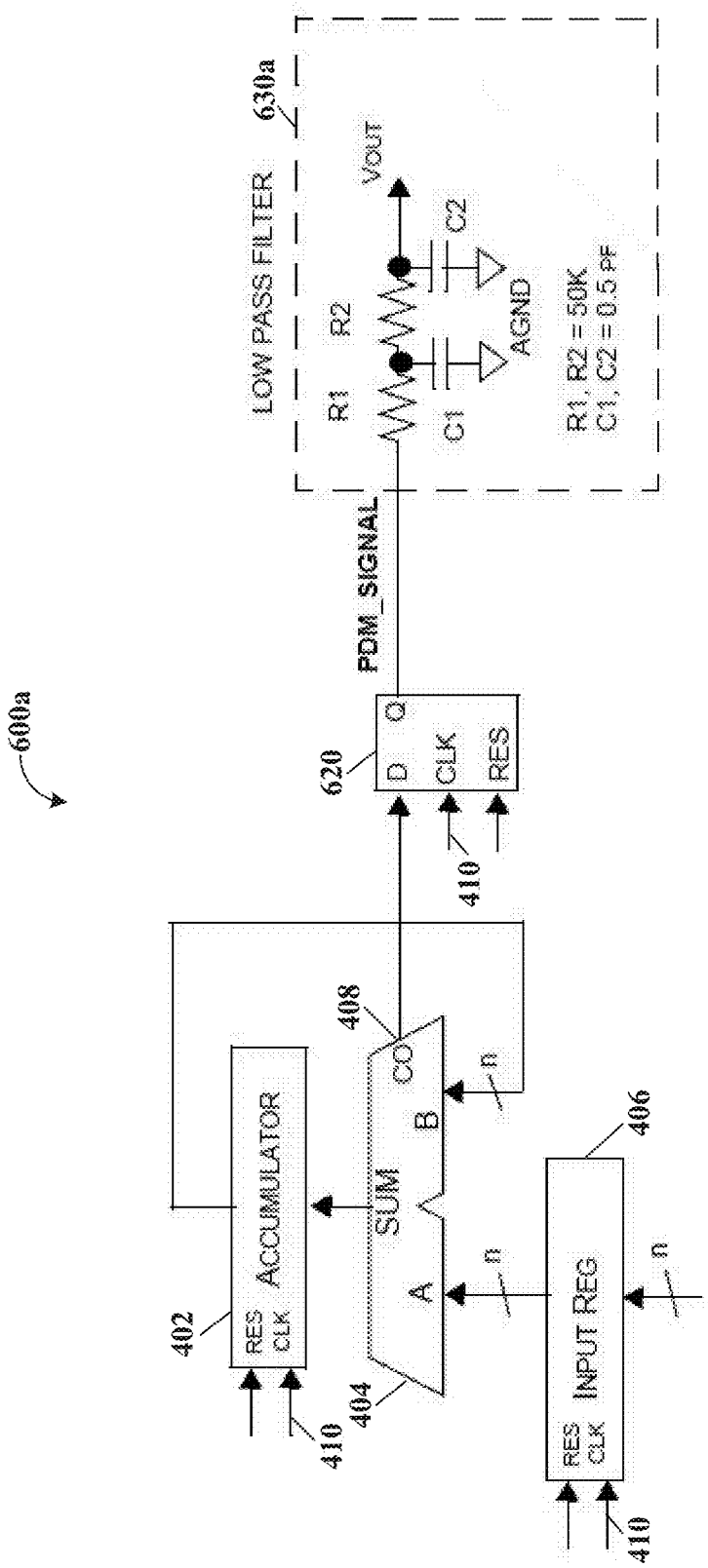
Figure 6B:
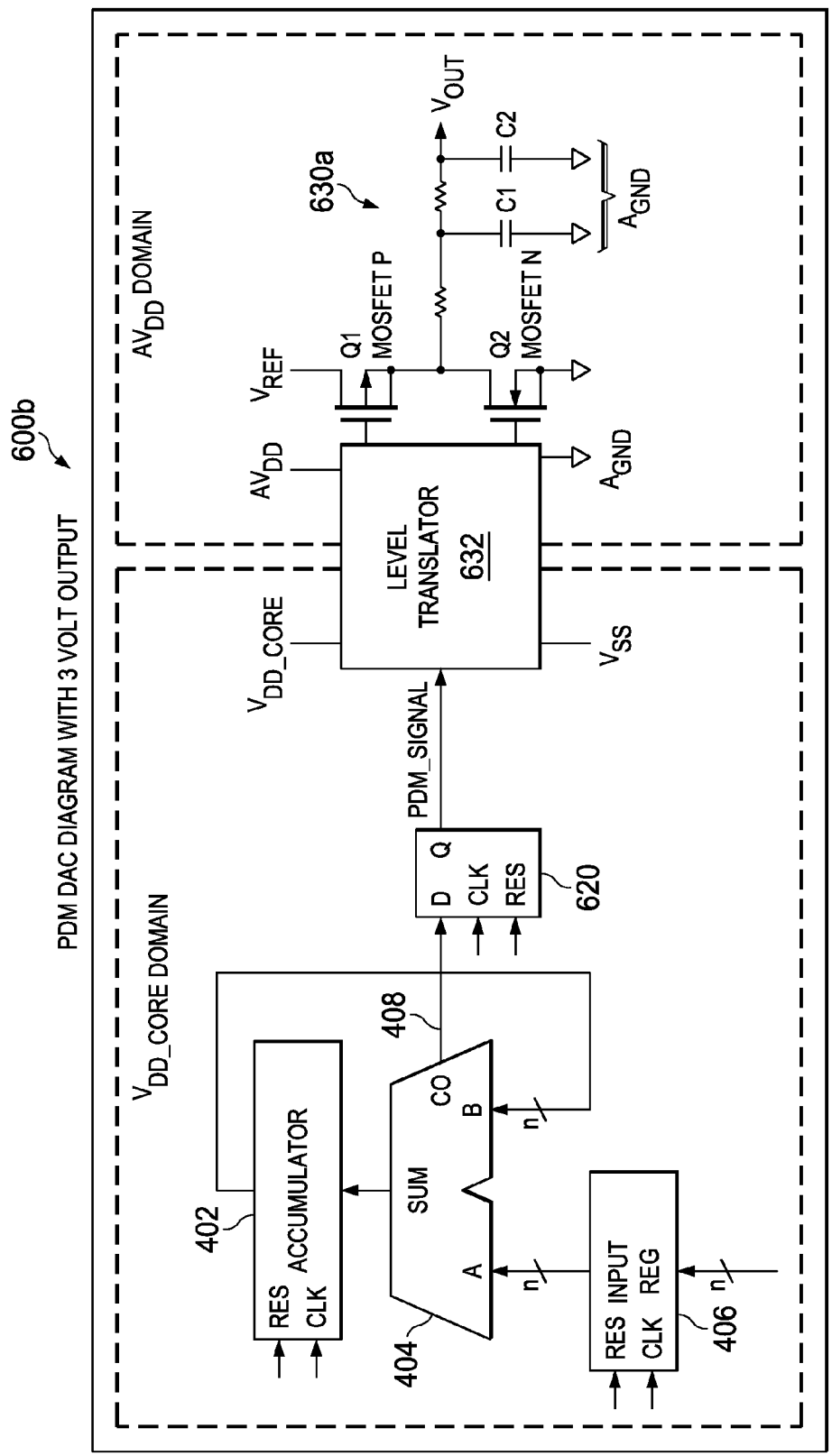

Referring to FIGS. 6, 6A and 6B, depicted are schematic block diagrams of simplified PDM DACs, according to specific example embodiments of this disclosure. A PDM DACs, generally represented by the numerals 600, 600a and 600b; may comprise an accumulator register 402, an adder (summer) 404, an increment value (DAC value) register 406 that generates overflow carry outputs (CO) 408 at a rate proportional to a value in the increment value register 406 and a D-latch 620. The CO 408 is coupled to the D-input of a latch 620. The Q-output of the D-latch 620 is coupled to a driver circuit comprising transistors 622 and 624 configured as a complementary metal oxide semiconductor (CMOS) driver. The output of this driver circuit may be coupled to a low pass filter, e.g., resistor 626 and capacitor 628 (RC) low pass filter 630. The low pass filter 630 shown in FIG. 6 is a single pole RC low pass filter, and the low pass filter 630a shown in FIGS. 6A and 6B is a two pole RC low pass filter.

The accumulator register 402 and the adder 404 constantly add an increment value from the increment value register 406 to an accumulated sum in the adder 404. For non zero input values, the accumulated sum will eventually overflow, wherein this overflow may be indicated via the adder 404 "carry out" signal (CO) 408. The rate that the overflow occurs is related to the size of the increment value from the increment value register 406 versus the maximum value that the adder 404 can handle. For example, a 12-bit adder 404 has a maximum output of 0xFFF. If the inputs to the adder 404, the accumulator value and the input value, exceed 0xFFF, then a carry out 408 is generated. The larger the input value, the more frequent the carry out 408 may be generated. The resultant pulse from the carry out 408 stream is then filtered via a low pass filter 630 or 630a. The resultant analog output voltage from the low pass filter 630 or 630a is proportional to the data input increment value from the increment value register 406. The low pass filter 630 or 630a may be the dominant "cost" for the complete PDM DAC. Using higher clock rates for the PDM DAC 600 allows the use of smaller low pass filter 630 or 630a components, thus reducing the module cost. Higher clock rates also support higher conversion speeds making the PDM DAC 600 useable for a wider range of applications. However, the use of higher clock rates will also increase the current consumption of the PDM DAC 600.

It is contemplated and within the scope of this disclosure that any low pass filter circuit design may be used to filter the output of the driver comprising transistors 622 and 624 and produce an analog voltage signal, and one having ordinary skill in circuit design and the benefit of this disclosure may readily be able to design such a low pass filter circuit. Referring to FIG. 6B, depicted is a schematic block diagram of a PDM generator 600b having a translated 3 volt output, according to specific example embodiments of this disclosure. The circuit shown in FIG. 6B is similar to the circuit shown in FIG. 6A, with the addition of a level translator 632 adapted to amplify the digital output signal from the latch 620 to provide a 3 volt output signal to drive the driver transistors Q1 and Q2.

Figure 7:
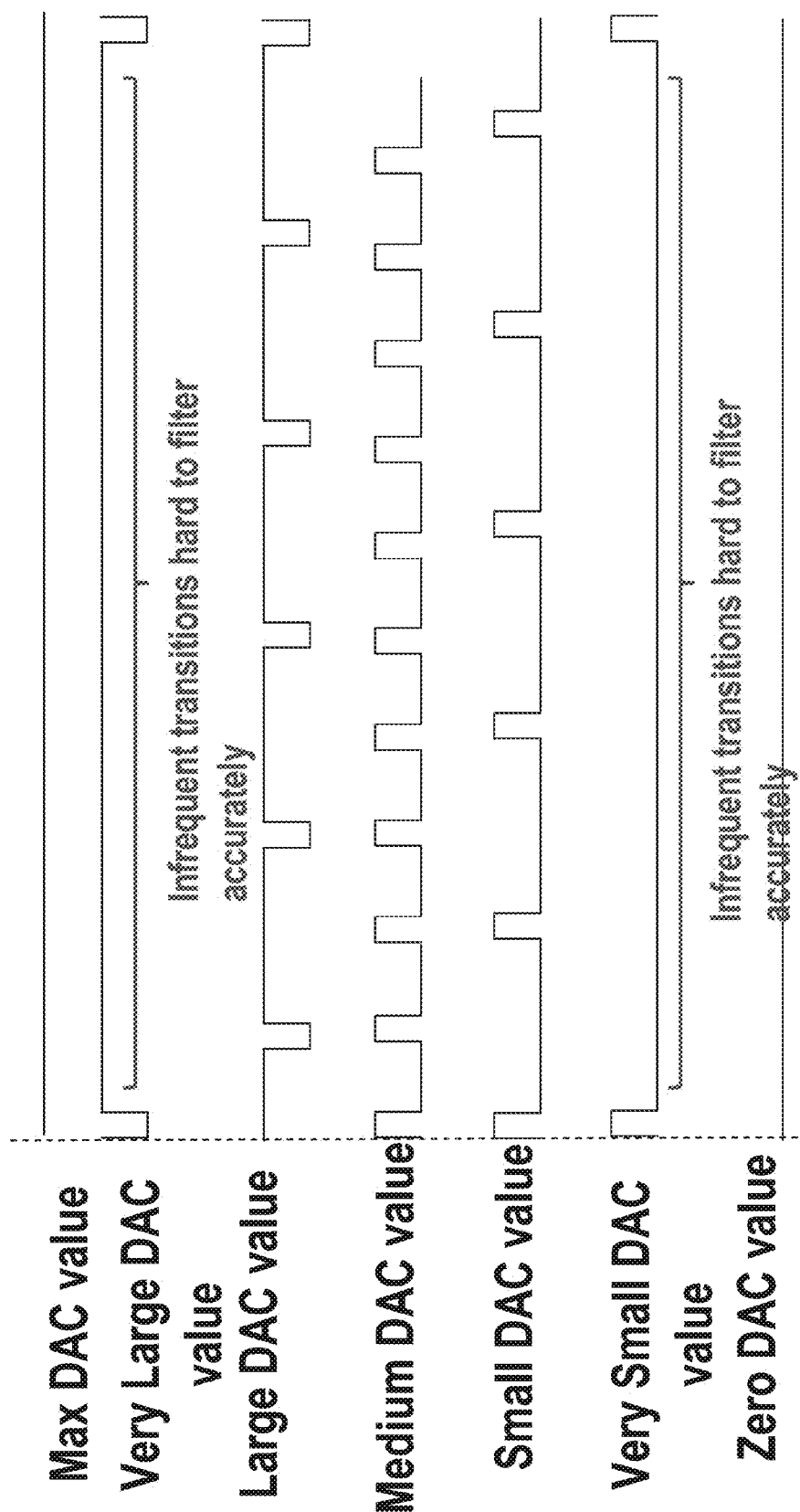
FIG. 7 illustrates schematic waveform timing diagrams showing various PDM bit-stream signals, according to the teachings of this disclosure.

Referring to FIG. 7, depicted are schematic waveform timing diagrams showing various PDM bit-stream signals, according to the teachings of this disclosure. Assuming a simple single pole RC filter, very small (~1%) and very large (~99%) DAC values require excessive filtering to reduce voltage ripple.

Figure 8:
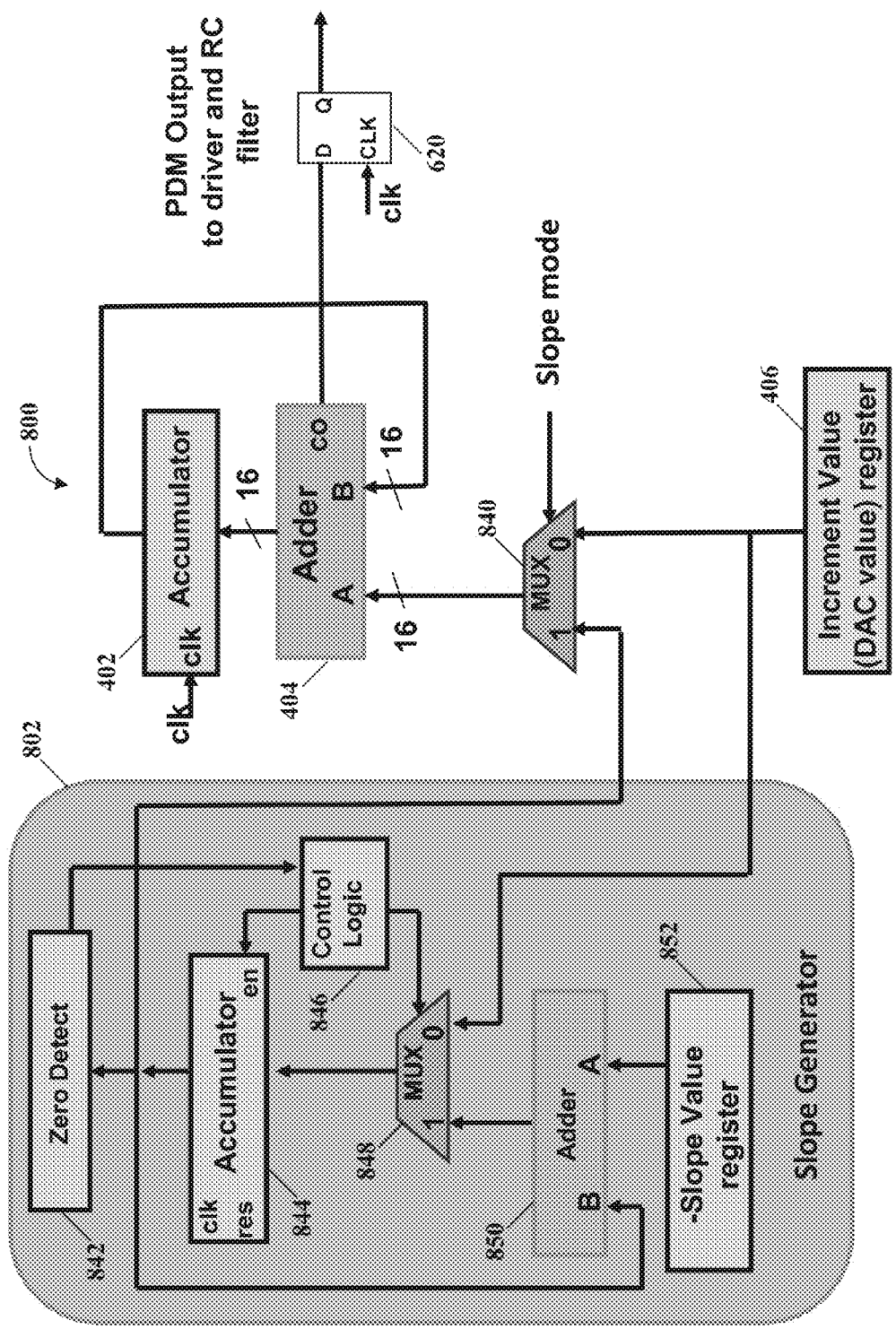
FIGS. 8 and 9 illustrate schematic block diagrams of PDM DACs and slope generators, according to a specific example embodiment of this disclosure.
Figure 9:
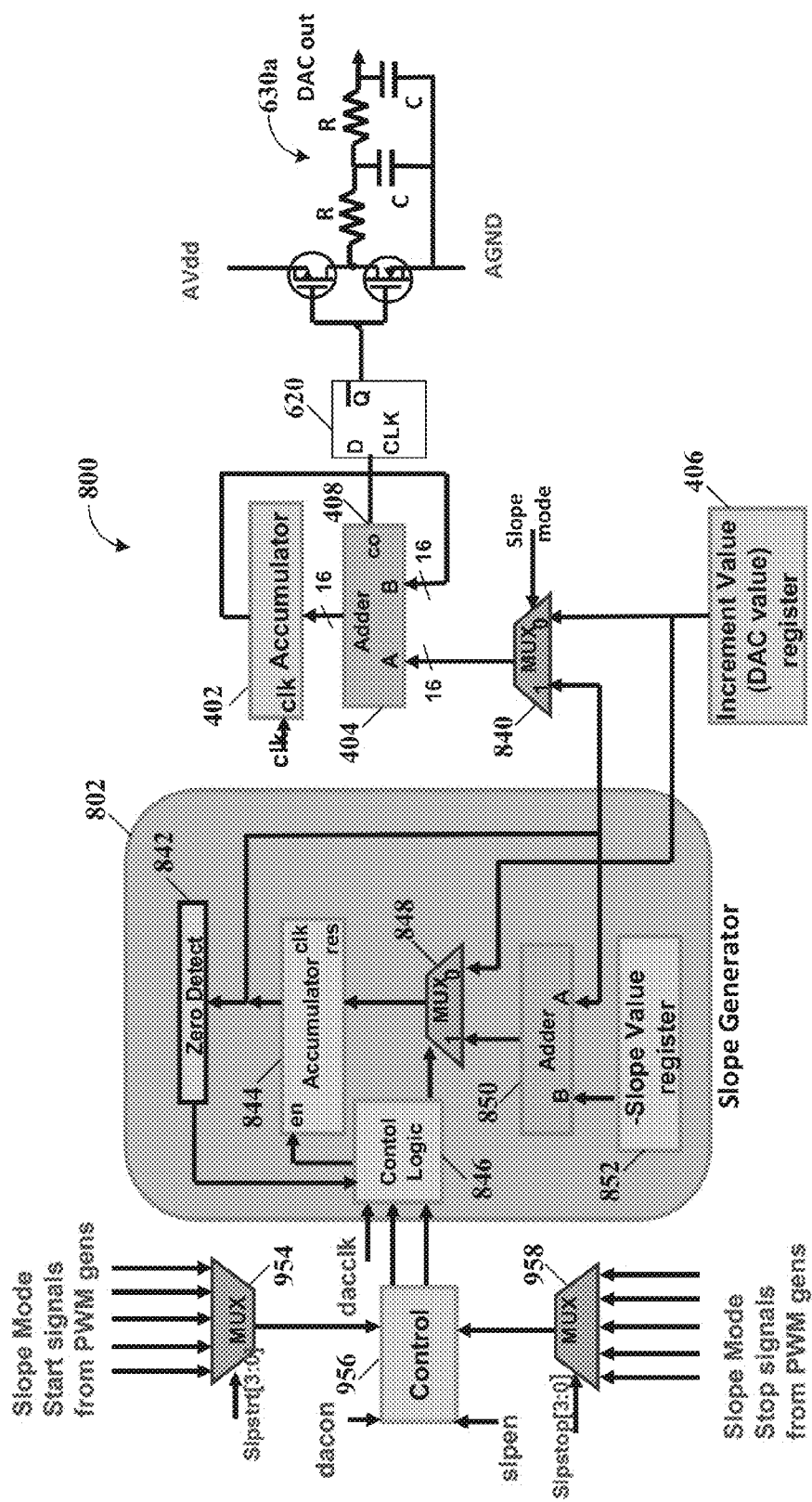

Referring to FIGS. 8 and 9, depicted are schematic block diagrams of PDM DACs with slope generators, according to specific example embodiments of this disclosure. A slope generator, generally represented by the numeral 802, may comprise a zero detector 842, an accumulator 844, control logic 846, a multiplexer 848, and adder 850 and a negative slope value register 852. A PDM DAC, generally represented by the numeral 800, may function in substantially the same way as the PDM DACs 600, 600a and 600b shown in FIGS. 6, 6A and 6B, respectively, and may comprise a accumulator 402, an adder 404, an increment value (data input) register 406, and a multiplexer 840 configured as shown in FIG. 8.

Referring to FIG. 9, a multiplexer 954 may be used to select a start signal from an external source, and the multiplexer 958 may be used to select a stop signal from an external source. Control logic 956 may provide start and stop signals to control logic 846.

The purpose of the zero detector 842 is to detect if the slope accumulator 844 has gone to zero or below zero prior to detecting a slope stop signal via multiplexer 958. When the slope accumulator 844 goes below zero, the contents thereof represent a negative number. Negative numbers look like very large positive numbers to the PDM generator 800. This is not a desired situation. The zero detector 842 detects zero or negative numbers and forces them to zero. This prevents large negative values from reaching the PDM generator 800.

The slope selection multiplexer 840 selects as the data input to the PDM DAC 800 either the DAC input register 406 or the slope generator 802 output depending on the operation desired by the user. For operation not using the slope generator 802, the slope generator 802 may be disabled to reduce power consumption. When the slope functionality is desired, the user may set a control register bit that asserts the "slope mode" signal that controls the multiplexer 840 to select the slope generator 802 as the source for the PDM DAC 800.

In normal PDM DAC 800 operation where the user is not performing a slope function, the signal "slope mode" is de-asserted (zero) and the PDM DAC 800 is in "normal mode." In normal mode, the multiplexer 840 always selects the input register 406, therefore the slope circuitry 802 is not utilized. In normal mode, the user wants to generate an output voltage proportional to the data value stored in the input register 406. Therefore the contents of the input register 406 are added to the accumulator 402 via the adder 404 every clock cycle. As the input is constantly added to the accumulator 402, the value in the accumulator 402 will grow with each clock cycle. Eventually, the adder 404 will overflow (generate a carry output (CO) 408) as the computed sum of the accumulator 402 and the input register 406 gets too large to fit in the specified width of the adder 404. The rate that the overflow (carry out (CO) 408) is generated is proportional to the input data value in register 406. For example: if the circuitry is 16-bits wide, and the input data value in register 406 is 1, then after the accumulator 402 reaches a value of 65,535, the next cycle will generate an overflow. If the input value is 16,384, then after four iterations, the adder 404 will generate an overflow. The faster the overflow (carry out (CO) 408) signal is generated, the more pulses per unit time are fed into the output filter 630*a*, and the larger will be the output voltage generated.

When the signal "slope mode" is asserted (logic one), the PDM DAC 800 is now in "slope mode." In slope mode, the multiplexer 840 selects the output of the slope generator 802, therefore the slope generator 802 is utilized. In slope mode, the user wants to generate an output voltage that starts at the value specified in the input register 406 and then slopes downward towards zero volts at a user specified rate in the slope register 852. FIG. 9 shows the control logic 956 and the start and stop multiplexers 954, and 958 that select start and stop signals, respectively, from elsewhere in the system (outside of this module) that initiate (start) and then terminate (stop) the slope process. Prior to the start of a slope process, the control logic 846 controls the slope multiplexer 848 to input the DAC increment value register 406 as the input to the slope accumulator 844. In this state, the DAC increment value register 406 is constantly clocked into the slope accumulator 844 and the output of the slope accumulator 844 is selected as the input to the multiplexer 840. Therefore, prior to the initiation of a slope process, the PDM DAC 800 functions in a manner similar to "normal mode," producing a stream of carry out pulses determined by the value in the DAC increment value register 406.

When the selected, via multiplexer 954, slope start signal is asserted, the control logic 956 enables the slope input multiplexer 848 to select the output of the adder 850 as the input to the slope accumulator 844. The slope accumulator 844 constantly adds a negative value stored in negative slope value register 852 to the slope accumulator 844. Therefore on each clock cycle, the contents of the slope accumulator 844 are decreased until the accumulator value reaches zero or goes negative, or if the selected stop signal, via multiplexer 958, is asserted. At this point in time, the slope process is terminated (stopped) and the slope multiplexer 848 may be controlled to select the DAC input register 406 as the input to the slope accumulator 844. At this time, the PDM DAC 800 is now operating in a manner similar to "normal mode" where the output voltage of the PDM DAC 800 is specified via the DAC input register 406.

Figure 10:
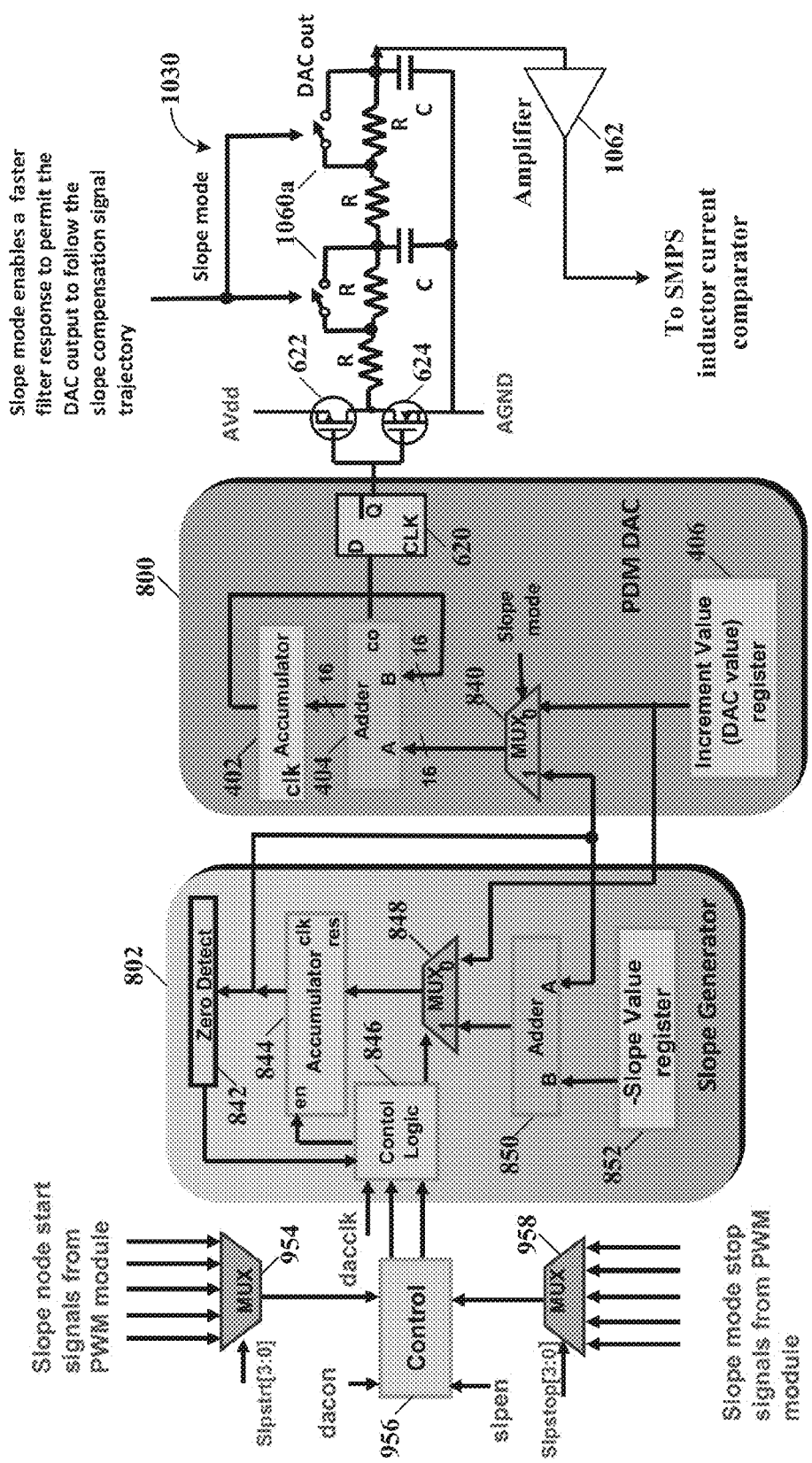
FIG. 10 illustrates a schematic block diagram of the PDM DAC and slope generator shown in FIG. 9 and further comprising a selectable response low pass filter after the PDM ADC, according to another specific example embodiment of this disclosure.

Referring to FIG. 10, depicted is a schematic block diagram of the PDM DAC and slope generator shown in FIG. 9 and further comprising a selectable response low pass filter 1030 after the PDM DAC 800, according to another specific example embodiment of this disclosure.

Figure 11:
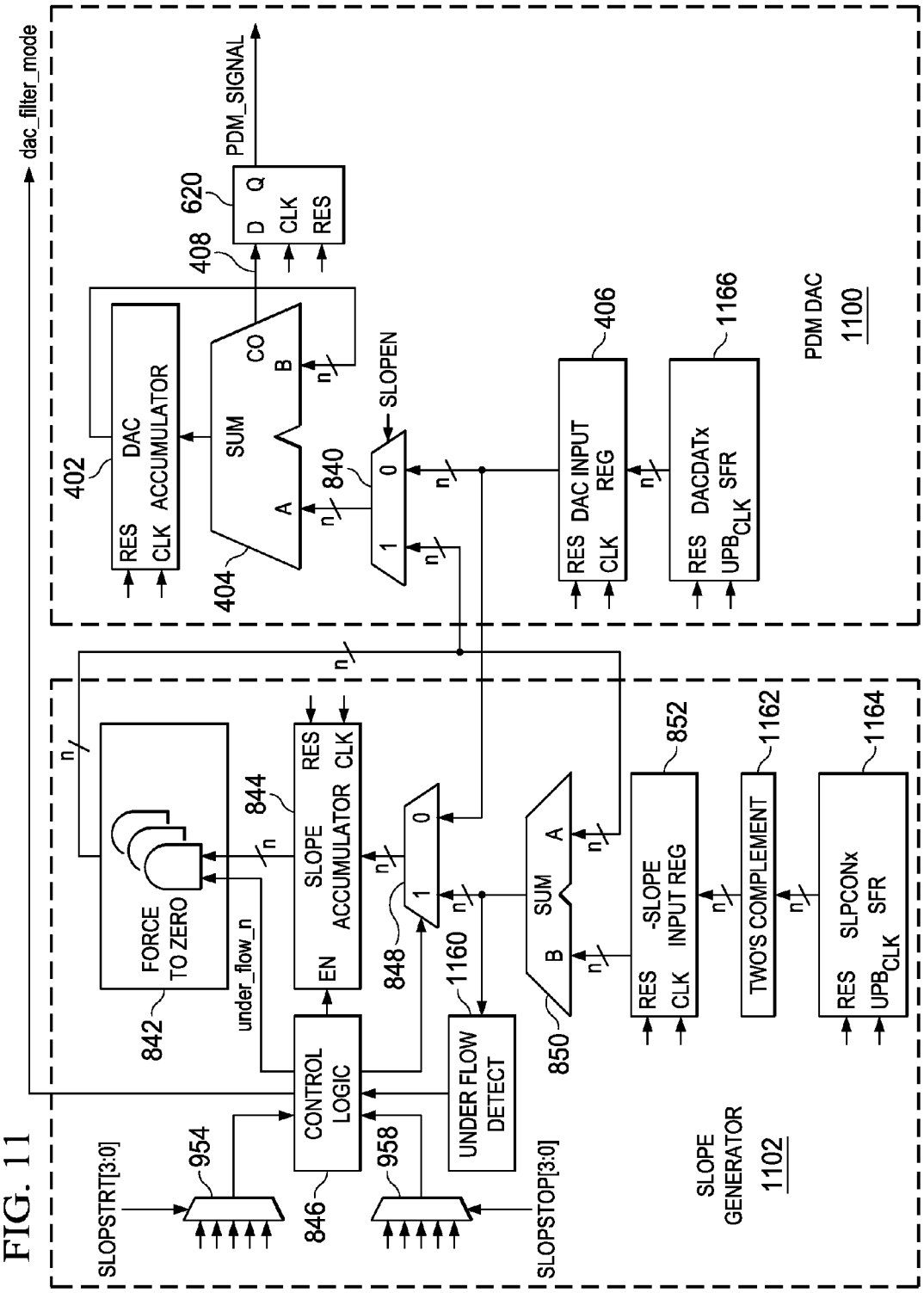
FIG. 11 illustrates a schematic block diagram of a PDM DAC and slope generator, according to another specific example embodiment of this disclosure.

FIG. 11 shows the addition of a second accumulator circuit that may implement, for example but is not limited to, a slope generator. The input value to the slope generator 1102 is negated (two's complement) prior to inputting to the circuit. When the slope period is initiated by a selected slope start (SLOPSTRT[3:0]) signal with multiplexer 954, the slope input value will be subtracted from the slope accumulator 844 on every clock cycle. When slope compensation circuitry is enabled and started, the PDM DAC 1100 input data value is repeatedly decreased at a user determined rate until the DAC data value is reduced to zero or a stop signal is received from multiplexer 958. As the DAC input data value is decreased, the PDM DAC 1100 output voltage will also decrease to zero. This constantly decreasing slope accumulator value is fed into the PDM DAC 1100 as the new DAC data value. The PDM DAC 1100 output bit stream density will decrease to zero, and the resultant voltage at the filter output, e.g., 1030, will also decrease to zero volts. This downward output voltage slope is the "slope compensation" function.

When the slope accumulator 844 decreases to where the slope adder 850 value experiences underflow (goes negative), the input value is forced to zero by zero force logic 842. This zero clamping is required to prevent a small negative number from being interpreted as a large positive number by the PDM DAC 1100. When the selected slope stop (SLOPSTOP[3:0]) signal is detected, the slope mode is stopped and the PDM DAC 1100 reverts back to normal operation of providing a specified steady state voltage.

The circuit shown in FIG. 11 is very similar to the one shown in FIG. 9, the differences being the slightly increased detail regarding a method to implement some specific example embodiments according to the teachings of this disclosure. The slope input register 1164 contains a positive value that represents the desired slope rate for the slope generator 1102. The slope generator 1102 uses a negative increment value in the slope input register 852. To simplify the usage of the circuit by a wide variety of users, it was decided that a positive slope decrement value is more likely to be understood than a negative slope increment. Therefore the desired user slope decrement value is input by the user into the register 1164. The contents of the register 1164 is negated by using a two's complement circuit 1162 that logically inverts the data (ones become zeroes, and zeroes become ones) and then adds +1 to the inverted value. Two's complement conversion is an industry standard method. The output of the two's complement circuit 1162 is a negative number that is input to the register 852. It is contemplated and within the scope of this disclosure that a negative slope decrement value may also be used without requiring twos complement inversion.

Figure 12:
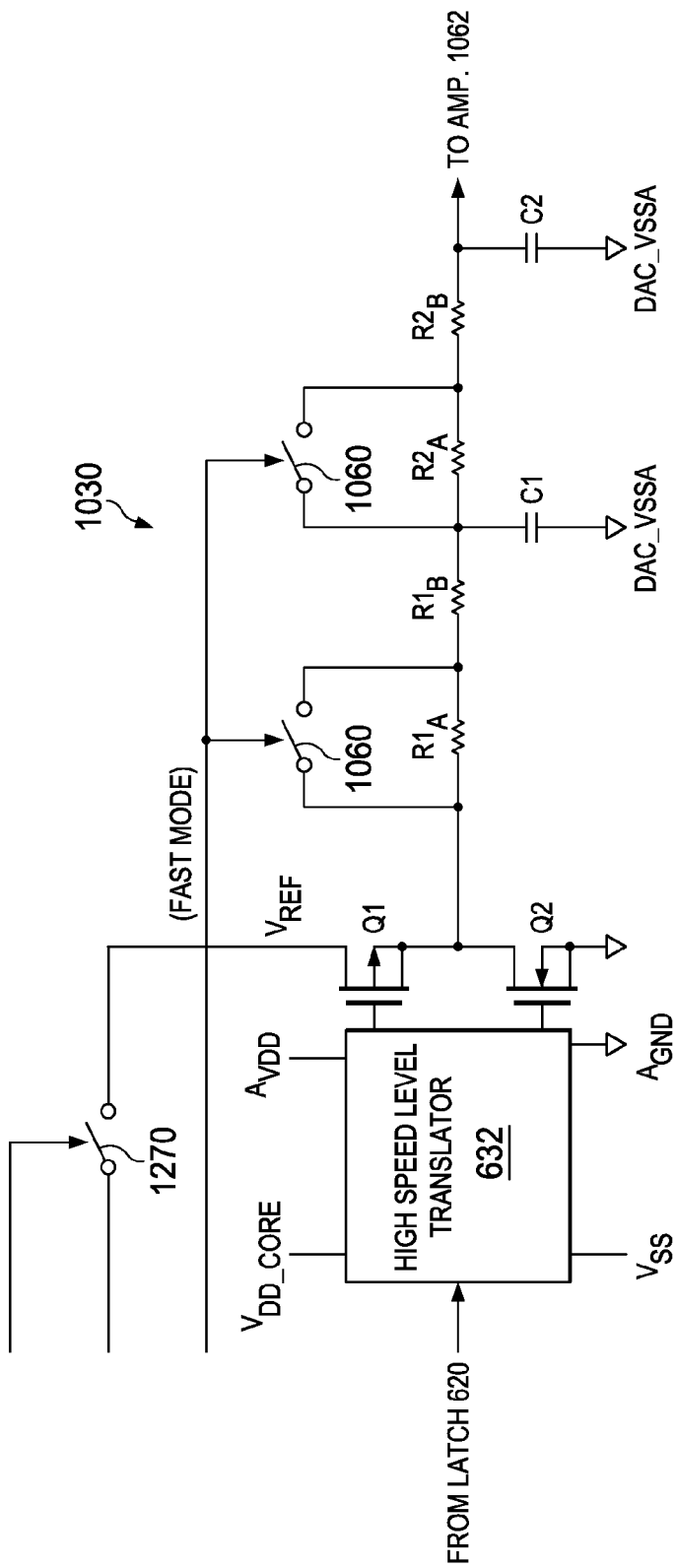
FIG. 12 illustrates a detailed schematic diagram of a PDM DAC low pass filter having selectable characteristics, according to specific example embodiments of this disclosure.

Referring to FIG. 12, depicted is a detailed schematic diagram of a PDM DAC low pass filter having selectable characteristics, according to specific example embodiments of this disclosure. The selectable response low pass filter 1030 shown in FIG. 12 is a dual response double pole RC filter. The dual response mode may provide a longer time constant for steady state operation of the SMPS where the maximum control accuracy is required, and a faster response during slope mode so as to track the PDM DAC output down the slope to zero as fast as possible. The choice of filter responses may be made using analog switches 1060 to select various resistance values for the selectable response low pass filter 1030.

Figure 13:
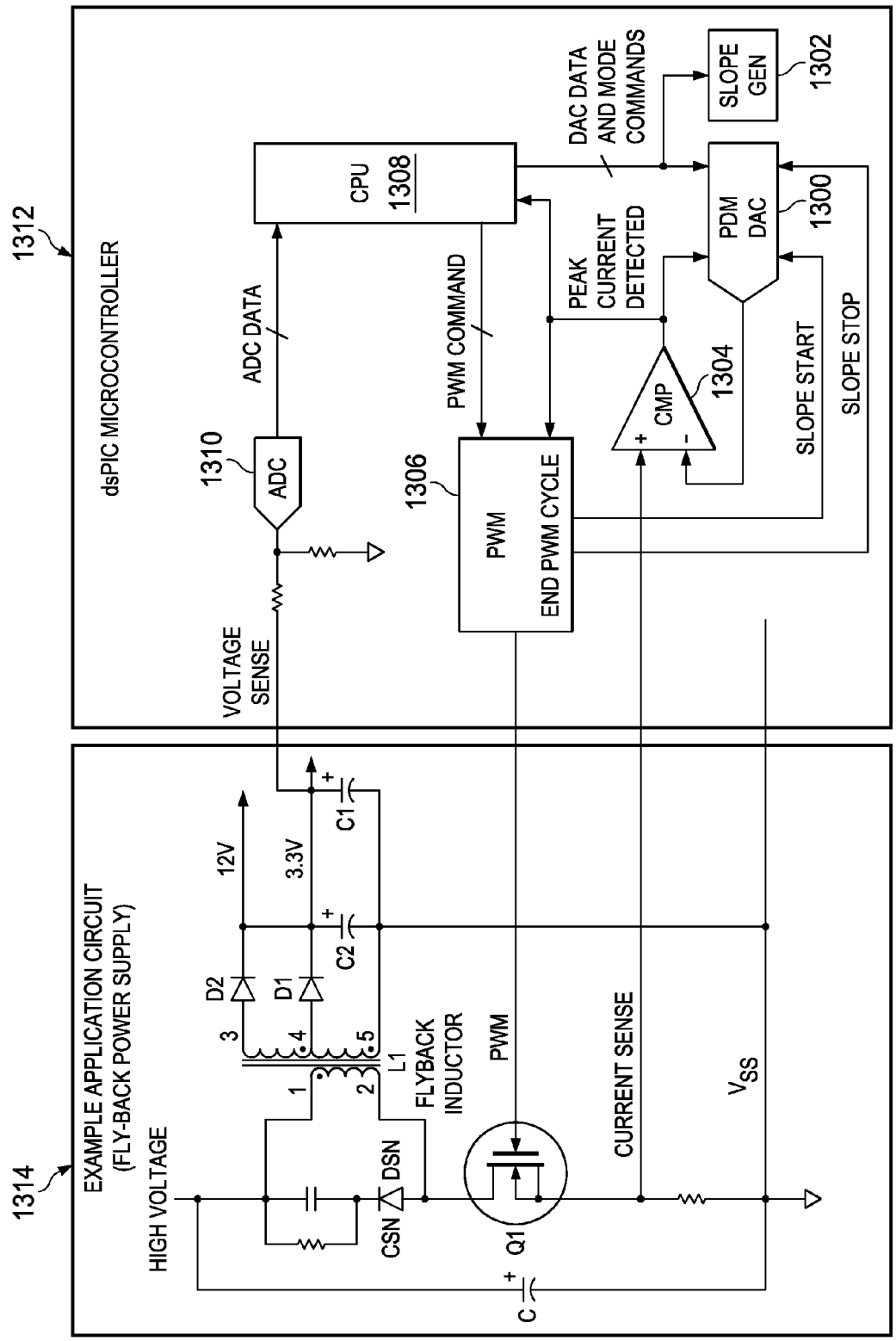
FIG. 13 illustrates a schematic block diagram of a boost switched-mode power converter with slope compensation, according to the teachings of this disclosure.

Referring to FIG. 13, depicted is a schematic block diagram of a boost switched-mode power converter with slope compensation, according to the teachings of this disclosure. The switched-mode power supply may comprise a power converter 1314 having, for example but not limited to, a power inductor L1, a power switching transistor Q1, power rectifiers D1 and D2, a filter capacitor C1, a voltage sense line, and a mixed signal integrated circuit 1312, e.g., microcontroller. The mixed signal integrated circuit 1312 may comprise an analog-to-digital converter (ADC) 1310, a digital processor, e.g., central processing unit (CPU) 1308, a pulse width modulation (PWM) generator 1306, a voltage comparator 1304, a PDM DAC 1300 and a slope generator 1302.

The ADC 1310 receives a voltage sample from the output of the power converter 1314 (voltage on C1) and converts it into a digital representation thereof. This digital representation is read by the CPU 1308. The PWM generator 1306 provides PWM control pulses to the power switching transistor Q1 according to information received from the CPU 1308, e.g., increase on times of PWM pulses if sampled voltage is less than a reference voltage or decrease on times of the PWM pulses if the sampled voltage is greater than the reference voltage. The PWM generator 1306 also controls when the slope compensation is enabled or disabled. The CPU 1308 may provide values to the increment register 406 and the slope value register 852. The PDM DAC 1300 provides an analog voltage from the output of the low pass filter, e.g., from the amplifier 1062 output to the SMPS inductor current comparator (see FIG. 10). The output from the comparator 1304 may start and stop the PDM DAC 1300 operation cycles.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse density modulated digital-to-analog converter (PDM DAC) with slope compensation function, comprising:
   the PDM DAC comprising
   a PDM DAC accumulator,
   PDM DAC adder having an output coupled to an input of the PDM DAC accumulator and a second input coupled to an output of the PDM DAC accumulator,
   a PDM DAC multiplexer having an output coupled to a first input of the PDM DAC adder, and
   a PDM DAC increment value register having an output coupled to a first input of the PDM DAC multiplexer;
   a slope generator comprising
   a slope generator accumulator having an output coupled to a second input of the PDM DAC multiplexer,
   a slope generator multiplexer having an output coupled to an input of the slope generator accumulator and a first input coupled to the output of the PDM DAC increment value register,
   a slope value register,
   a slope generator adder having an output coupled to a second input of the slope generator multiplexer, a first input coupled to an output of the slope value register and a second input coupled to the output of the slope generator accumulator,
   a non-positive detect circuit having an input coupled to the output of the slope generator accumulator, and
   control logic having an input coupled to an output of the non-positive detect circuit, a first control output coupled to an enable input of the slope generator accumulator and a second control output coupled to a control input of the slope generator multiplexer; and
   a D-latch having a D-input coupled to a carry-out output of the PDM DAC adder and a clock input coupled to a clock signal;
   wherein when a zero or negative output from the slope generator accumulator is detected by the non-positive detect circuit the control logic forces a zero output from the slope generator accumulator, and when a slope mode control signal is applied to the PDM DAC multiplexer the first input of the PDM DAC adder is coupled to the output of the slope generator accumulator, otherwise to the output of the PDM DAC increment value register.

2. The PDM DAC according to claim 1, further comprising a low pass filter having an input coupled to an output of the D-latch.

3. The PDM DAC according to claim 2, wherein the low pass filter response characteristics are selectable.

4. The PDM DAC according to claim 2, wherein the low pass filter comprises a plurality of poles.

5. The PDM DAC according to claim 4, wherein a slope value is negative in the slope value register.

6. The PDM DAC according to claim 1, wherein a slope value is positive in the slope value register.

7. The PDM DAC according to claim 6, further comprising a two's complement circuit for two's complementing the positive slope value in the slope value register before coupling the two's complemented slope value to the slope generator adder.

8. The PDM DAC according to claim 1, further comprising an under flow detection circuit having an input coupled to the output of the slope generator adder and an output coupled to an input of the control logic.

9. A switched-mode power supply (SMPS) controller comprising the PDM DAC with slope compensation function according to claim 1.

10. A switch mode power supply (SMPS) having a PDM DAC with slope compensation function, comprising:
    power converter comprising a power inductor, power switching transistor, rectifiers and filter capacitor; and
    a mixed signal integrated circuit comprising
    pulse width modulation (PWM) generator,
    a digital processor coupled to and issuing PWM commands to the PWM generator,
    an analog-to-digital converter (ADC) having an analog input coupled to a voltage output of the filter capacitor of the power converter,
    a PDM generator,
    a voltage comparator having a first input coupled to a current measurement circuit in the power converter,
    a pulse density modulated digital-to-analog converter (PDM DAC) with slope compensation function according to claim 1, and having an analog output coupled to a second input of the voltage comparator and a control input coupled to an output of the voltage comparator.

11. The SMPS according to claim 10, wherein the mixed signal integrated circuit is a microcontroller.

12. A pulse density modulated (PDM) digital-to-analog converter (DAC) with slope compensation function, comprising:
    a PDM accumulator circuit for generating a PDM pulse stream with a pulse density proportional to an input data value, wherein the PDM accumulator operates at very high speeds to minimize output low pass filter requirements when converting the PDM pulse stream into an analog voltage; and
    a slope accumulator circuit that modifies the input data value to the PDM DAC so as to create a controlled change in a PDM pulse density, wherein the slope accumulator circuit provides a slope compensation function.

13. The PDM DAC according to claim 12, further comprising a selectable response low pass analog filter for converting the PDM pulse stream into the analog voltage.

14. A method of providing slope compensation voltages in a current mode controlled switch mode power supply (SMPS), said method comprising the steps of:
    generating pulse division modulated (PDM) signals with a PDM digital-to-analog converter (DAC);
    modifying the PDM DAC signals with a digital slope generator; and
    coupling the modified PDM DAC signals to an analog low pass filter for providing slope compensation voltages in a current mode controlled SMPS.

15. The method according to claim 14, wherein the analog low pass filter has a plurality of poles.

16. The method according to claim 14, wherein the analog low pass filter has selectable filter characteristics.

17. The method according to claim 14, further comprising the step of selecting characteristics of the low pass filter.

18. The method according to claim 17, wherein the step of selecting the characteristics of the low pass filter provides for reduced voltage ripple.

19. The method according to claim 14, further comprising the steps of:
   detecting a zero value in a slope accumulator; and
   forcing the zero value to remain in the slope accumulator when the zero value is detected.

20. The method according to claim 14, further comprising the step of disabling the digital slope generator to reduce power consumption.

* * * * *